United States Patent [19]

Okamoto et al.

[11] Patent Number: 4,872,139
[45] Date of Patent: Oct. 3, 1989

[54] MEMORY PROTECTION DEVICE FOR AN ELECTRONIC APPARATUS

[75] Inventors: Kazuhiko Okamoto, Nara; Akira Kanayama, Yamatokoriyama, both of Japan

[73] Assignee: Sharp Kabushiki Kaisha, Osaka, Japan

[21] Appl. No.: 2,194

[22] Filed: Jan. 12, 1987

[30] Foreign Application Priority Data

Jan. 21, 1986 [JP] Japan .................................. 61-7437

[51] Int. Cl.⁴ .......................... G11C 5/02; H02B 5/00; H01H 9/20
[52] U.S. Cl. ...................................... 365/52; 365/63; 365/228; 361/344; 200/50 A
[58] Field of Search ..................... 365/52, 53, 63, 112; 361/337, 344, 394, 413, 415; 200/50 A

[56] References Cited

U.S. PATENT DOCUMENTS

| | | | |
|---|---|---|---|
| 4,542,372 | 9/1985 | Takach, Jr. ........................ | 200/50 A |
| 4,563,552 | 1/1986 | Fushimoto ........................ | 200/50 A |
| 4,602,351 | 7/1986 | Shimamura et al. ............... | 365/52 |
| 4,607,351 | 8/1986 | Gerber et al. .................... | 365/228 |
| 4,628,484 | 12/1986 | Hattori ............................. | 365/52 |

FOREIGN PATENT DOCUMENTS 2339434 8/1982 Fed. Rep. of Germany .

OTHER PUBLICATIONS

Capousis et al., "Protective Container for Integrated Circuit Modules", IBM Technical Disclosure Bulletin, vol. 17, No. 10, Mar. 1975, pp. 2972-2973.

Primary Examiner—Terrell W. Fears
Assistant Examiner—Glenn A. Gossage
Attorney, Agent, or Firm—Birch, Stewart, Kolasch & Birch

[57] ABSTRACT

A memory protection device for an electronic apparatus has a cartridge storage portion for accommodating a memory cartridge. The memory cartridge stores data for the electronic apparatus. This memory protection device further comprises a lid connected to the cartridge storage portion, a sensor for detecting the opened/closed condition of the lid, and a disconnecting circuit which is responsive to the opened condition of the lid for electrically disconnecting the memory cartridge from a control circuit in the electronic apparatus when the cartridge in installed in the cartridge storage portion.

10 Claims, 1 Drawing Sheet

MEMORY PROTECTION DEVICE FOR AN ELECTRONIC APPARATUS

BACKGROUND OF THE INVENTION

The present invention relates to an electronic apparatus, and more particularly, to a memory protection device for an electronic apparatus of the type in which a memory cartridge is electrically connected to and disconnected from, via a memory cartridge storage portion, the electronic apparatus such as a printer or a calculating machine or the like.

In the conventional electronic apparatus of the type in which a memory cartridge is connected to and disconnected from, at a cartridge storage portion, the electronic apparatus, the contents of the memory cartridge may be destroyed due to the introduction of noise or static electricity through a connection terminal when the memory cartridge is pulled out while the main power to the electronic apparatus is being supplied.

Therefore, to protect such a problem, the main power to the electronic apparatus is necessarily switched off before the memory cartridge is removed from the memory cartridge portion.

However, since the memory cartridge can be removed from the cartridge portion in the above type of electronic apparatus without switching off the main power to the electronic apparatus, some possible erroneous destruction of the memory contents cannot be prevented.

SUMMARY OF THE INVENTION

Accordingly, it is an objective of the present invention to provide an improved memory protection device for an electronic apparatus with a simplified configuration.

It is another objective of the present invention to provide an improved memory protection circuit for an electronic apparatus such as a printer or a calculating machine.

Briefly described, in accordance with the present invention, an electronic apparatus of the type which comprises a memory cartridge portion for accommodating a memory cartridge therein and connecting the memory cartridge electrically to the electronic apparatus, is charcterized by comprising lid means for opening and closing the memory cartridge portion, detection means for detecting the opened/closed condition of the lid means, and disconnecting means responsive to the opened condition of the lid means for disconnecting the memory cartridge, stored within the cartridge portion, electrically from a control unit of the electronic apparatus.

BRIEF DESCRIPTION OF THE DRAWINGS

The present invention will become more fully understood from the detailed description given below and the accompanying drawings which are given by way of illustration only, and thus are not limitative of the present invention and wherein.

DESCRIPTION OF THE PREFERRED EMBODIMENT

Figure 1:
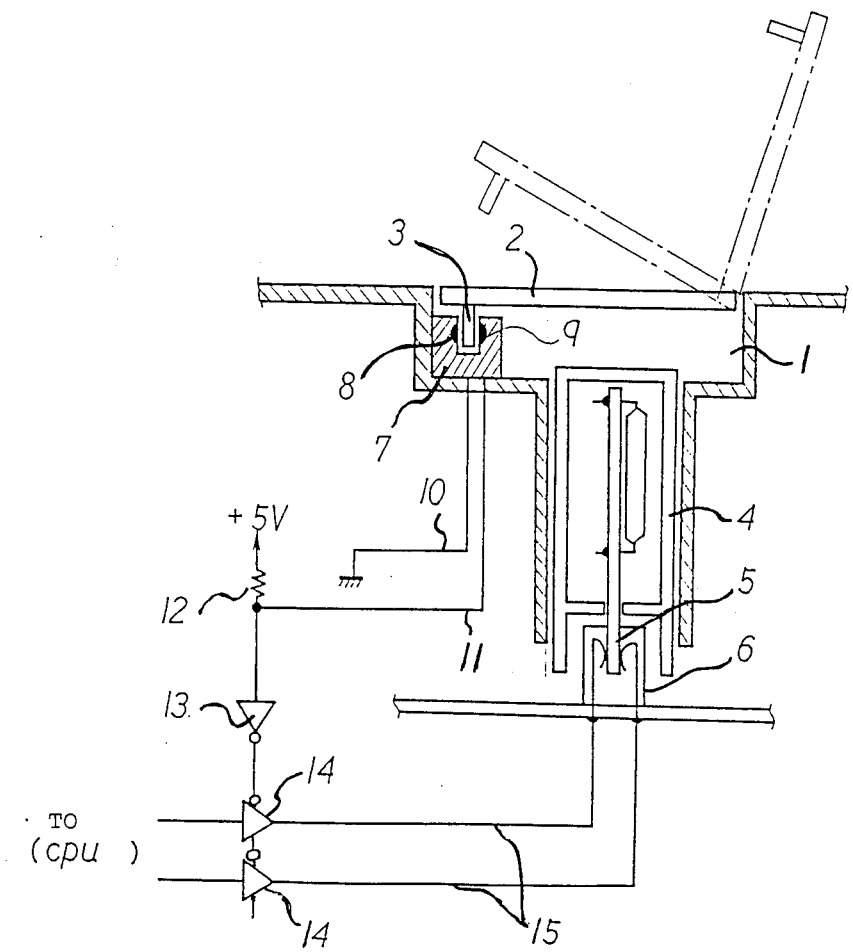
FIG. 1 is a schematic drawing of a memory protection device for an electronic apparatus according to the preferred embodiment of the present invention.
Figure 2:
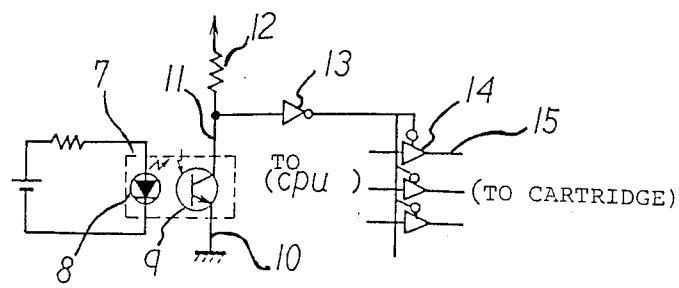
FIG. 2 is a block diagram of the memory protection device of FIG. 1.

FIG. 1 is a schematic drawing of a memory protection device for an electronic apparatus such as a printer, a calculating machine, or the like according to the preferred embodiment of the present invention. FIG. 2 is a block diagram of the memory protection device of FIG. 1.

The electronic apparatus comprises a cartridge storage 1 installed in the electronic apparatus for storing a memory cartridge, and a lid 2 for protecting the cartridge storage 1 from the outside environment. A projection 3 is projected from the lid 2. The lid 2 can be manually opened and closed. A memory cartridge 4 is provided for storing data for the electronic apparatus. A terminal 5 is provided in the cartridge 4. When the memory cartridge 4 is completely stored within the cartridge storage 1, the terminal 5 of the memory cartridge 4 is engaged with a terminal 6 which is connected to a Central Processing Unit (CPU) of the electronic apparatus.

A sensor or photointerpreter 7 is provided for detecting the opening condition of the lid 2. The sensor 7 comprises a light emitting element 8 and a light receiving element 9 which are opposed to each other. When the lid 2 is closed, the projection is positioned between the light emitting element 8 and the light receiving element 9 so as to interrupt the light.

One terminal of the light receiving element 9 is grounded via line 10 while the other terminal is connected via line 11 to a junction between a resistance 12 and an inverter 13. The other end of the resistance 12 is pulled-up with a power source of +5 V. A gate circuit 14 is responsive to the output signal of the inverter 13 to control whether the signal from the terminal 6 is transferred to the CPU of the electronic apparatus or not.

In operation, when the lid 2 is closed, the projection 3 is imbedded within the cavity of the sensor 7 as represented in the solid line of FIG. 1, so that the light between the light emitting element 8 and the light receiving element 9 is interrupted and a high level signal appears on the line 11. Therefore, the output signal of the inverter 13 is a low level signal to make the gate circuit 14 conductive, so that the terminal 6 is connected with the CPU of the electronic apparatus through the line 15. When the memory cartridge 4 is installed within the cartridge storage 1 at that time, the memory cartridge 4 is electrically connected with the electronic apparatus.

On the other hand, when the lid 2 is opened, the projection 3 is removed from the cavity of the sensor 7, so that the light receiving element 9 can receive the light from the light emitting element 8. A low level signal appears on the line 11. The output signal of the inverter 13 is a high level signal thereby making the gate circuit 14 nonconductive, whereby the terminal 6 is electrically isolated from the CPU of the electronic apparatus.

Thus, whenever the memory cartridge 4 is taken out of the cartridge storage 1 by opening the lid 2, line 15 is automatically disconnected from the CPU of the electronic apparatus so as to protect the contents of the memory cartridge 4.

According to the feature of the present invention, whenever the memory cartridge is removed from the cartridge storage by opening the lid of the cartridge storage, the cartridge is automatically electrically isolated from the CPU of the electronic apparatus. The contents of the memory cartridge is thus protected by using a simple structure.

While only certain embodiments of the present invention have been described, it will be apparent to those skilled in the art that various changes and modifications may be made therein without departing from the spirit and scope of the present invention as claimed.

What is claimed is:

1. A memory protection device for an electronic apparatus, the electronic apparatus having a cartridge storage compartment for accommodating a memory cartridge, the memory cartridge storing data for the electronic apparatus, comprising:
   a lid connected to the cartridge storage compartment;
   sensor means, responsive to said lid, for detecting an opened condition of said lid; and
   disconnecting means, responsive to said sensor means, for electrically disconnecting the memory cartridge from a control unit of the electronic apparatus when said lid is in the opened position and the memory cartridge is installed within the cartridge storage compartment.

2. The protection device as claimed in claim 1, wherein said disconnecting means includes an inverter and a gate circuit.

3. The protection device as claimed in claim 1, wherein said electronic apparatus is a printer.

4. The protection device as claimed in claim 1, wherein said electronic apparatus is a calculating machine.

5. A memory protection device for an electronic apparatus having a control unit, comprising:
   memory means for storing data to be used by said electronic apparatus;
   holding means, for receiving said memory means; said holding means including,
   connecting means, for providing an electrical receptacle for said memory means such that said memory means is capable of electrically communicating with said control unit;
   lid means, connected to said holding means, for providing an opened/closed condition with respect to said holding means;
   sensing means, responsive to said lid means, for detecting said opened/closed condition of said lid means; and
   disconnecting means, responsive to said sensing means, for electrically disconnecting said memory means from said control unit, when said lid means is in the opened position and said memory means is located in said holding means thereby preventing electrical communication between said memory means and said control unit.

6. The memory protection device as claimed in claim 5, wherein said sensing means includes:
   light emitting means, for generating a light signal; and
   light receiving means, for receiving said light signal from said light generating means; said light receiving means only receives said light signal when said lid means is in said opened condition.

7. The protection device as claimed in claim 5, wherein said disconnecting means includes an inverter and a gate circuit.

8. A memory protection device for protecting a memory cartridge which communicates with and stores data for a control unit, comprising:
   holding means, for receiving the memory cartridge and for providing an electrical receptacle for the memory cartridge such that the memory cartridge is capable of electrically communicating with the control unit;
   lid means, connected to said holding means, for providing an opened/closed condition with respect to said holding means;
   sensing means, responsive to said lid means, for detecting said opened/closed condition of said lid means; and
   disconnecting means, responsive to said sensing means, for preventing said electrical communication between the memory cartridge and the control unit when said lid means is in the opened position and the memory cartridge is located in said holding means, thereby preventing erroneous destruction of the stored data in the memory cartridge when physically disconnecting the memory cartridge from the electronic apparatus.

9. The memory protection device as claimed in claim 8, wherein said sensing means includes:
   light emitting means, for generating a light signal; and
   light receiving means, for receiving said light signal from said light generating means;
   said light receiving means only receives said light signal when said lid means is in said opened condition.

10. The protection device as claimed in claim 8, wherein said disconnecting means includes an inverter and a gate circuit.

* * * * *